(12) United States Patent
Cardona et al.

(10) Patent No.: US 8,130,058 B2
(45) Date of Patent: *Mar. 6, 2012

(54) SWITCHABLE TUNABLE ACOUSTIC RESONATOR USING BST MATERIAL

(75) Inventors: Albert Humirang Cardona, Santa Barbara, CA (US); Robert Armstrong York, Santa Barbara, CA (US)

(73) Assignee: Agile RF, Inc., Goleta, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/690,415

(22) Filed: Jan. 20, 2010

(65) Prior Publication Data

US 2010/0109808 A1 May 6, 2010

Related U.S. Application Data

(63) Continuation of application No. 11/682,252, filed on Mar. 5, 2007, now Pat. No. 7,675,388.

(60) Provisional application No. 60/780,229, filed on Mar. 7, 2006, provisional application No. 60/835,253, filed on Aug. 2, 2006.

(51) Int. Cl.
*H03H 9/54* (2006.01)
*H03H 9/70* (2006.01)

(52) U.S. Cl. .................... 333/133; 333/188

(58) Field of Classification Search .......... 333/188, 333/191, 133
See application file for complete search history.

(56) References Cited

U.S. PATENT DOCUMENTS

| | | |
|---|---|---|
| 2,802,171 A | 8/1957 | Minder |
| 3,562,637 A | 2/1971 | Gikow |
| 5,273,609 A | 12/1993 | Moslehi |
| 5,382,930 A | 1/1995 | Stokes et al. |
| 5,489,548 A | 2/1996 | Nishioka et al. |
| 5,593,914 A | 1/1997 | Evans, Jr. et al. |
| 5,714,917 A | 2/1998 | Ella |
| 5,721,700 A | 2/1998 | Katoh |
| 5,790,367 A | 8/1998 | Mateika et al. |

(Continued)

FOREIGN PATENT DOCUMENTS

WO   WO 02/23633 A2   3/2002

(Continued)

OTHER PUBLICATIONS

Erker, Erich G. et al., "Monolithic Ka-Band Phase Shifter Using Voltage Tunable BaSrTiO3 Parallel Plate Capacitors," IEEE Microwave and Guided Wave Letters, vol. 10, No. 1, Jan. 2000, pp. 10-12.

(Continued)

*Primary Examiner* — Benny Lee
*Assistant Examiner* — Alan Wong
(74) *Attorney, Agent, or Firm* — Fenwick & West LLP

(57) ABSTRACT

An acoustic resonator includes a first electrode, a second electrode, and a barium strontium titanate (BST) dielectric layer disposed between the first electrode and the second electrode, where the acoustic resonator is switched on as a resonator with a resonant frequency if a DC (direct current) bias voltage is applied across the BST dielectric layer. The acoustic resonator is also switched off if no DC bias voltage is applied across the BST dielectric layer. Furthermore, the resonant frequency of the acoustic resonator can be tuned based on a level of the DC bias voltage, with the resonant frequency increasing as the level of the DC bias voltage applied to the BST acoustic resonator increases.

18 Claims, 8 Drawing Sheets

U.S. PATENT DOCUMENTS

| | | | |
|---|---|---|---|
| 6,077,737 | A | 6/2000 | Yang et al. |
| 6,222,245 | B1 | 4/2001 | Bez et al. |
| 6,300,654 | B1 | 10/2001 | Corvasce et al. |
| 6,377,440 | B1 | 4/2002 | Zhu et al. |
| 6,383,858 | B1 | 5/2002 | Gupta et al. |
| 6,432,794 | B1 | 8/2002 | Lou |
| 6,451,665 | B1 | 9/2002 | Yunogami et al. |
| 6,452,776 | B1 | 9/2002 | Chakravorty |
| 6,503,792 | B2 | 1/2003 | Hartner et al. |
| 6,583,688 | B2 * | 6/2003 | Klee et al. ............ 333/188 |
| 6,646,499 | B2 | 11/2003 | Tiebout |
| 6,683,341 | B1 | 1/2004 | York |
| 6,737,930 | B2 | 5/2004 | Toncich |
| 6,768,396 | B2 | 7/2004 | Klee et al. |
| 6,847,271 | B2 | 1/2005 | Korden et al. |
| 6,924,583 | B2 | 8/2005 | Lin et al. |
| 7,042,701 | B2 | 5/2006 | Diorio et al. |
| 7,098,575 | B2 | 8/2006 | Mehta |
| 7,586,391 | B2 * | 9/2009 | Volatier et al. ............ 333/188 |
| 7,675,388 | B2 * | 3/2010 | Cardona et al. ............ 333/133 |
| 2001/0028285 | A1 | 10/2001 | Klee et al. |
| 2001/0048352 | A1 | 12/2001 | Klee et al. |
| 2003/0067023 | A1 | 4/2003 | Olewine et al. |
| 2003/0227338 | A1 | 12/2003 | Kawakubo et al. |
| 2004/0087082 | A1 | 5/2004 | Nakata |
| 2004/0164367 | A1 | 8/2004 | Park |
| 2004/0212277 | A1 | 10/2004 | Stommer |
| 2004/0259316 | A1 | 12/2004 | Acikel et al. |
| 2006/0012021 | A1 | 1/2006 | Larson, III et al. |
| 2008/0129416 | A1 | 6/2008 | Volatier et al. |

FOREIGN PATENT DOCUMENTS

| | | |
|---|---|---|
| WO | WO 2005/034345 A1 | 4/2005 |
| WO | WO 2006/004470 A1 | 1/2006 |

OTHER PUBLICATIONS

Liu, Yu et al., "BaSrTioO$_3$ Interdigitated Capacitors for Distributed Phase Shifter Applications," IEEE Microwave and Guided Wave Letters, vol. 10, No. 11, Nov. 2000, pp. 448-450.

Nagra, Amit S. et al., "Distributed Analog Phase Shifters with Low Insertion Loss," IEEE Transactions on Microwave Theory and Techniques, vol. 47, No. 9, Sep. 1999, pp. 1705-1711.

Padmini, P. et al., "Realization of High Tunability Barium Strontium Titanate Thin Films by RF Magnetron Sputtering," Applied Physics Letters, vol. 75, Nov. 1999, pp. 3186-3188.

Taylor, T. R. et al., "Impact of thermal strain on the dielectric constant of sputtered barium strontium titanate thin films," Applied Physics Letters, vol. 80, No. 11, Mar. 18, 2002, pp. 1978-1980.

Taylor, T. R. et al., "Optimization of RF Sputtered Barium Strontium Titanate (BST) Thin Films for High Tunability," presented at MRS Conference, Fall 1999, 2 pages [online], [retrieved on Jun. 24, 2003]. Retrieved from the Internet <URL: http://my.ece.ucsb.edu/yorklab/Publications/pubs.htm>, abstract only.

Taylor, T. R. et al., "RF Sputtered High Tunability Barium Strontium Titanate (BST) Thin Films for High Frequency Applications," presented at ISIF 2000 Conference, Aachen, Germany, Mar. 2000, 2 pages [online], [retrieved on Jun. 24, 2003]. Retrieved from the Internet <URL: http://my.cec.ucsb.edu/yorklab/Publications/pubs.htm>, abstract only.

York, Bob et al., "Thin-Film Ferroelectrics: Deposition Methods and Applications," presented at the International Microwave Symposium in Boston, MA, Jun. 2000, p. 20 [online], [retrieved on Jun. 23, 2004]. Retrieved from the Internet <URL: http://my.ece.ucsb.edu/yorklab/Projects/Ferroelectrics/IMS2000%20Workshop/Bob-oral.pdf>.

York, R. et al. "Microwave Integrated Circuits using Thin-Film BST," presented at ISAF Conference, Honolulu, Hawaii, Jul. 21-Aug. 2, 2000, 6 pages [online], [retrieved on Jun. 24, 2000]. Retrieved from the Internet <URL: http://my.ece.ucsb.edu/yorklab/Publications/pubs.htm>.

York, Robert A. et al., "Synthesis and Characterization of (Ba$_x$Sr$_{1-x}$)Ti$_{1+y}$O$_{3+z}$ Thin Films and Integration into Microwave Varactors and Phase Shifters," Journal of Integrated Ferroelectrics, vol. 34, Apr. 10, 2000, pp. 177-188.

York, Robert A. et al., "Thin-Film Phase Shifters for Low-Cost Phased Arrays," presented at Workshop on Affordability and Cost Reduction for Radar Systems, Huntsville, Alabama, Apr. 2000 and at URSI Conference, Salt Lake City, Utah, Jul. 2000, 10 pages [online], [retrieved on Jun. 24, 2003]. Retrieved from the Internet <URL: http://my.ece.ucsb.edu/yorklab/Publications/pubs.htm>.

PCT International Search Report and Written Opinion, PCT/US07/63372, Feb. 8, 2008, 8 pages.

Chase, D., et al., "Modeling the Capacitive Nonlinearity in Thin-Film BST Capacitors," IEEE Transactions on Microwave Theory and Techniques, Oct. 2005, p. 3215-3220, vol. 53, No. 10.

Krimholtz, R., et al., "New equivalent circuit for elementary piezoelectric transducers", Electronic Letters, Jun. 25, 1970, p. 398-399, vol. 6, No. 13.

Pervez, N. K., et al., "High tunability barium strontium titanate thin films for rf circuit applications," Applied Physics Letters, Nov. 8, 2004, p. 4451-4453, vol. 85, No. 19.

Morito, K., et al., "Electric field induced piezoelectric resonance in the micrometer to millimeter waveband in a thin film SrTiO$_3$ capacitor", Journal of Applied Physics, Oct. 15, 2003, p. 5199-5205, vol. 94, No. 8.

Noren, B., et al., "Thin Film Barium Strontium Titanate (BST) for a New Class of Tunable RF Components", Microwave Journal, May 2004, vol., 47, No. 5., 9 pages, can be retrieved from internet <URL:http://www.mwjournal.com/Journal/Print.asp?Id=AR_1203>.

Tappe, S., et al., "Electrostrictive resonances in (Ba$_{0.7}$Sr$_{0.3}$)TiO$_3$ thin films at microwave frequencies", Applied Physics Lett., Jul. 26, 2004, p. 624-626, vol. 85, No. 4.

Vorobiev, A., et al., "Microwave loss mechanisms in Ba0.25Sr0.75TiO3 thin film varactors", Journal of Applied Physics, Oct. 15, 2004, pp. 4642-4649, vol. 96, No. 8.

Vorobiev, A., et al., "Silicon substrate integrated high Q-factor parallel-plate ferroelectric varactors for microwave/millimeterwave applications", Applied Physics Letters, Oct. 13, 2003, p. 3144-3146, vol. 83, No. 15.

Bastelaer, V., "The Design of Band-Pass Filters with Piezoelectric Resonators," Revue HF, Jan. 1, 1968, pp. 193-206, vol. 7, No. 7.

Supplementary European Search Report dated Mar. 29, 2011, for European Patent Application No. EP 07757969.3, 6 pages.

* cited by examiner

SWITCHABLE TUNABLE ACOUSTIC RESONATOR USING BST MATERIAL

CROSS-REFERENCE TO RELATED APPLICATIONS

This application is a continuation application of, and claims priority under 35 U.S.C. §120 from, U.S. patent application Ser. No. 11/682,252 entitled "Switchable Tunable Acoustic Resonator Using BST Material," filed on Mar. 5, 2007, now issued as U.S. Pat. No. 7,675,388 on Mar. 9, 2010, which claims priority under 35 U.S.C. §119(e) from U.S. Provisional Patent Application No. 60/780,229, entitled "Piezoelectric Switch and FBAR," filed on Mar. 7, 2006, and from U.S. Provisional Patent Application No. 60/835,253, entitled "Voltage-Controlled Film Bulk Acoustic Resonators," filed on Aug. 2, 2006, the subject matters of all of which are incorporated by reference herein in their entirety.

BACKGROUND OF THE INVENTION

1. Field of the Invention

The present invention generally relates to acoustic resonators and their applications in electronic circuits.

2. Description of the Related Art

Capacitors are a basic building block for electronic circuits. One design for capacitors is the parallel-plate configuration, in which a dielectric is sandwiched between two electrodes. FIG. 1 is a block diagram illustrating a typical metal-insulator-metal (MIM) parallel plate configuration of a thin film capacitor 100. The capacitor 100 is formed as a vertical stack comprised of a metal base electrode 110b supported by a substrate 130, a dielectric 120, and metal top electrode 110a. The lateral dimensions, along with the dielectric constant and thickness of the dielectric 120, determine the capacitance value.

Materials in the barium strontium titanate (BST) family have characteristics that are well suited for use as the dielectric 120 in such capacitors 100. BST generally has a high dielectric constant so that large capacitances can be realized in a relatively small area. Furthermore, BST has a permittivity that depends on the applied electric field. In other words, thin-film BST has the remarkable property that the dielectric constant can be changed appreciably by an applied DC-field, allowing for very simple voltage-variable capacitors (varactors), with the added flexibility that their capacitance can be tuned by changing a bias voltage across the capacitor. In addition, the bias voltage typically can be applied in either direction across a BST capacitor since the film permittivity is generally symmetric about zero bias. That is, BST typically does not exhibit a preferred direction for the electric field. One further advantage is that the electrical currents that flow through BST capacitors are relatively small compared to other types of semiconductor varactors.

Such electrical characteristics of the BST capacitors allow other potential beneficial uses of the BST capacitors in electronic circuits.

SUMMARY OF THE INVENTION

Embodiments of the present invention include an acoustic resonator comprising a first electrode, a second electrode, and a barium strontium titanate (BST) dielectric layer disposed between the first electrode and the second electrode, where the acoustic resonator is switched on as a resonator with a resonant frequency if a DC (direct current) bias voltage is applied across the BST dielectric layer. The acoustic resonator is also switched off if no DC bias voltage is applied across the BST dielectric layer. Furthermore, the resonant frequency of the acoustic resonator can be tuned based on a level of the DC bias voltage, with the resonant frequency increasing as the level of the DC bias voltage increases.

In one embodiment, the acoustic resonator is formed on a sapphire substrate. In another embodiment, the acoustic resonator is formed over an air gap disposed between the second electrode and a substrate. In still another embodiment, the acoustic resonator is formed over an acoustic reflector disposed between the second electrode and a substrate, where the acoustic reflector is comprised of a plurality of alternating layers of platinum (Pt) and silicon dioxide ($SiO_2$) and reduces damping of the resonance of the acoustic resonator caused by the substrate. In still another embodiment of the present invention, the acoustic resonator includes a first part formed on a substrate and a second part formed over an air gap.

The BST based acoustic resonator of the present invention functions can be switched on or off simply based on whether a DC bias voltage is applied or not, and its resonant frequency can be tuned based on the level of the DC bias voltage. Thus, the BST based acoustic resonator has many versatile uses in electronic circuits, such as switchable, tunable filters and a duplexer for transmitting and receiving a radio frequency signal over an antenna.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

BST capacitors can be configured to exhibit the characteristics of an acoustic resonator if the BST capacitor is appropriately controlled. As the DC bias voltage to BST capacitors is increased, resonant dips in the reflection coefficient are observed. The frequency and depth of the resonance varies with the device area and electrode thicknesses as well as the DC bias voltage. Such resonance in the BST varactors is consistent with a thickness-mode acoustic resonance. BST (and also Strontium Titanate) exhibits a field-induced piezo-electricity, such that under bias the BST thin films can strongly couple electrical energy to acoustic vibration. This is sometimes called "electro-restrictive" behavior to distinguish the effect from a pure piezoelectric material which would also exhibit the inverse effect (where a mechanical deformation leads to an electrical polarization). In the context of BST varactors, this resonance is not especially desirable since it is effectively a loss mechanism that lowers the overall Q-factor of the device. For example, as the RF signal passes through a biased BST capacitor, part of its energy is converted into mechanical energy which then oscillates back-and-forth within the MIM structure forming a standing wave resonance. This standing wave will continue to draw energy away from the RF signal as long as the DC electric field remains. Consequently, this effect results in transmission loss in the BST capacitors.

Figure 2:
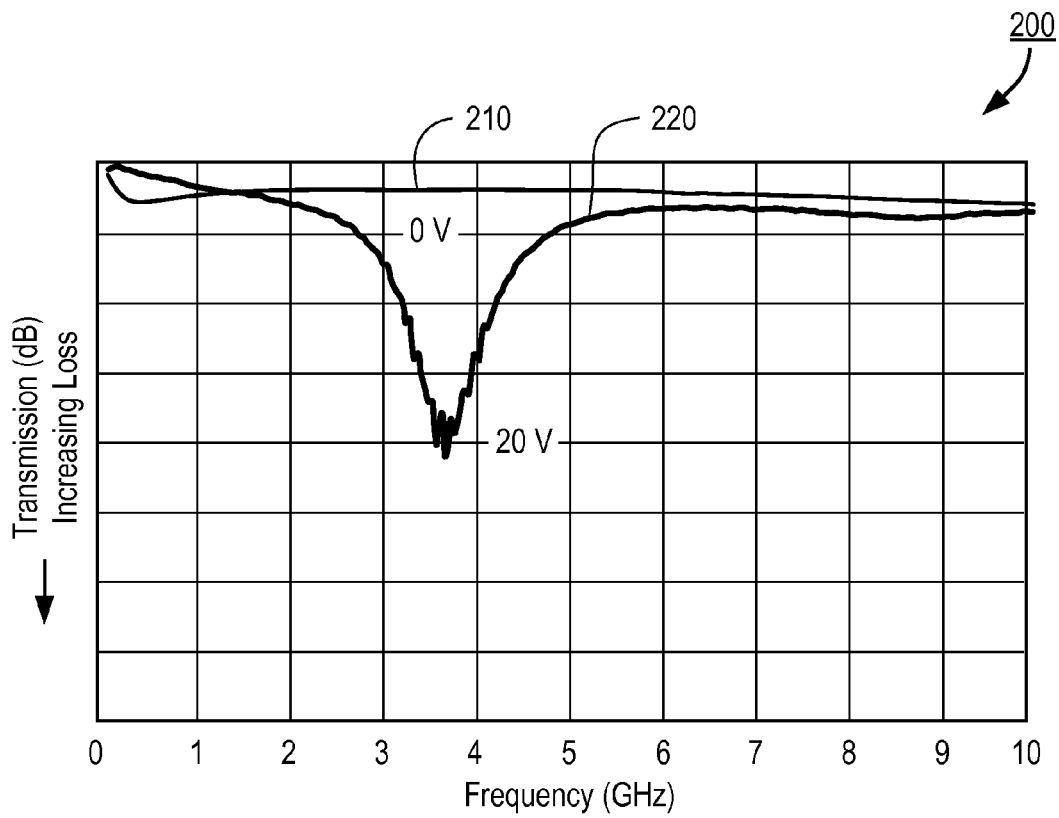
FIG. 2 is a graph illustrating RF transmission measurements of the BST capacitor of FIG. 1 as a function of the frequency of the RF signal.

FIG. 2 is a graph illustrating RF transmission measurements, of the capacitor 100 using the BST dielectric layer 120, as a function of the frequency of the RF signal voltage. Two curves 210, 220 are shown, corresponding to different applied DC voltages. At zero applied DC voltage, curve 210 shows a well-behaved flat response with no significant transmission loss. In contrast, at an applied DC voltage of 20 V, curve 220 shows a large resonance and transmission loss appearing at a specific resonant frequency of about 3.7 GHz caused by the piezoelectric effect of the BST material 120.

Such piezoelectric effects of the BST dielectric material 120, if carefully controlled, may be used to implement useful electrical components. It is beneficial to control the piezoelectric effects of the BST dielectric material used in varactors to implement useful electronic components.

Figure 1:
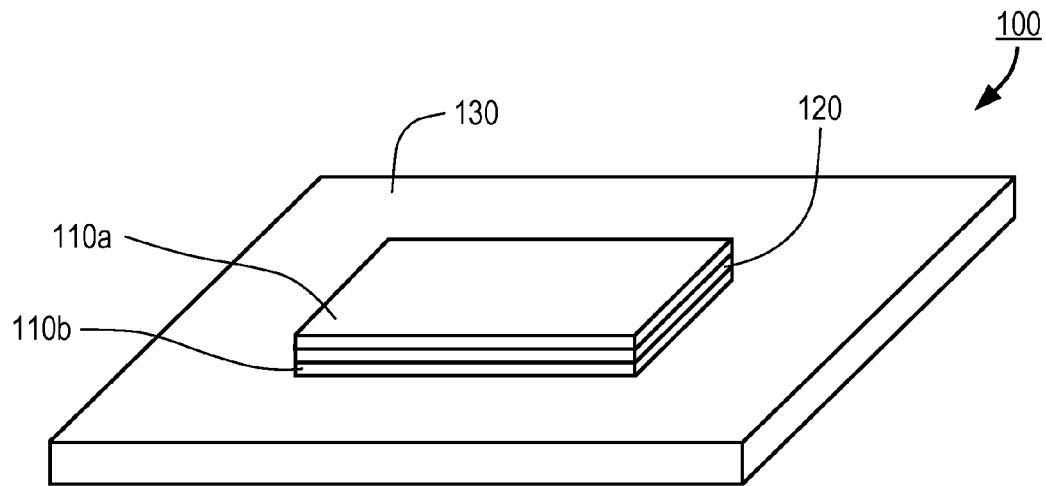
FIG. 1 is a block diagram illustrating a typical metal-insulator-metal (MIM) parallel plate configuration of a thin film BST capacitor according to one embodiment of the present invention.
Figure 3:
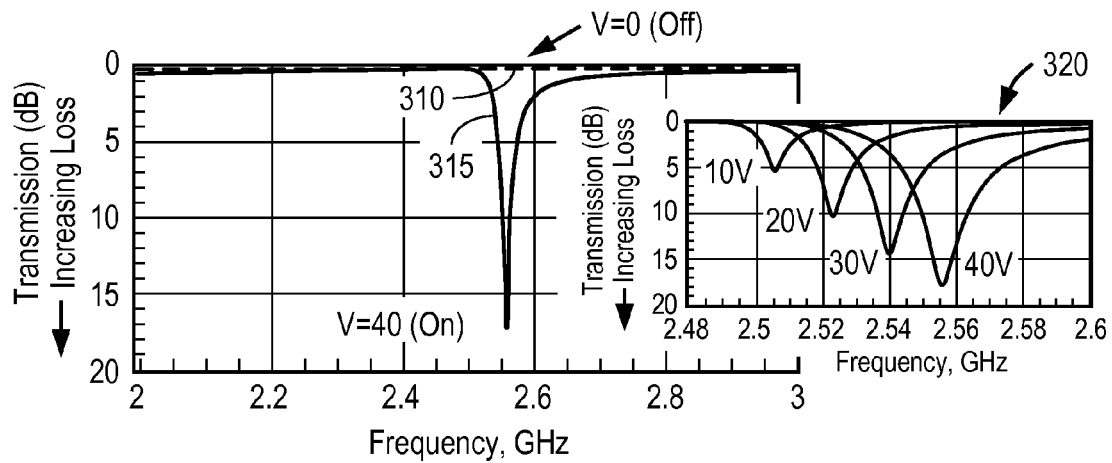
FIG. 3 is a graph illustrating RF transmission measurements of the BST capacitor of FIG. 1 as a function of the frequency of the RF signal under different DC bias voltages.

FIG. 3 is a graph illustrating RF transmission measurements of the BST capacitor of FIG. 1 as a function of the frequency of the RF signal under different DC bias voltages. The curve 310 shows the measurements under zero DC bias (V=0, off). At zero DC bias voltage, the BST-based varactor shows a well-behaved flat response with no significant transmission loss, as illustrated in curve 310. In contrast, at an applied DC voltage of 40 V, curve 315 shows a large anti-resonance and transmission loss appearing at around 2.55 GHz. Also, at applied voltages of 10V, 20V, 30V, and 40V, the curves 320 show a large resonance and transmission loss appearing at a certain frequency. At such resonant frequency, the BST varactor is in the high-impedance, anti-resonance state leading to a deep notch in the frequency response. The specific frequencies at which the anti-resonance occur increases as the DC bias voltage increases and the transmission loss at such frequency also increases as the DC bias voltages increase. In the off-state, the insertion loss is a function of the capacitive reactance of the BST varactor device. By increasing the device area, it is possible to improve the insertion loss of the off-state and create a more attractive notch filter with a higher loaded Q-factor. Therefore, the BST varactor can be used as a switchable resonator that is switched on with non-zero DC bias voltage but switched off with zero DC-bias voltage. Further, the anti-resonant frequency and the transmission losses through the BST varactor can also be controlled using different levels of the DC bias voltage. In essence, the BST varactor functions as a switchable and adjustable FBAR (Film Bulk Acoustic Resonator) device.

Figure 4:
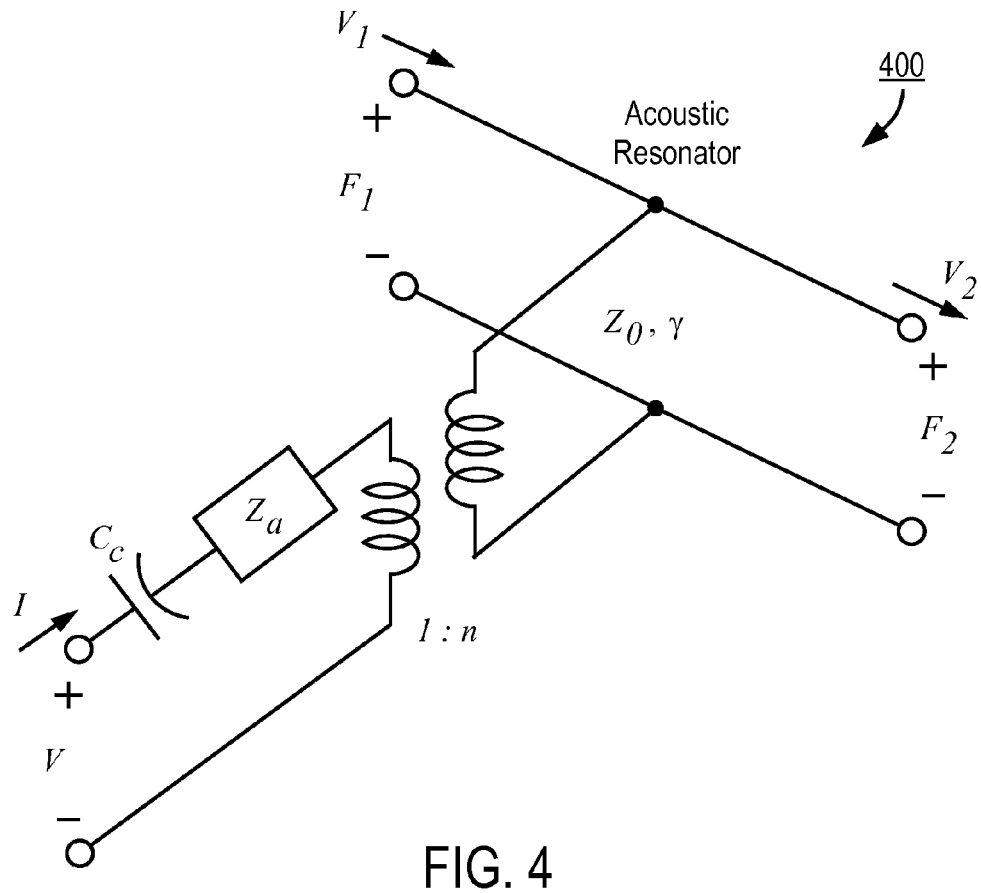
FIG. 4 is a diagram of an equivalent circuit modeling a piezo-electric transducer.

FIG. 4 is a diagram of an equivalent circuit modeling a piezo-electric transducer (acoustic resonator). Such equivalent circuit can also be used to model the piezo-electric characteristics of the BST varactor. The transducer can be represented by the KLM (Krimholtz, Leedhom, and Matthaei) model. The KLM model uses an equivalent transmission-line circuit to model the one-dimensional acoustic wave problem. In the KLM model described in FIG. 4, V is the voltage applied to the acoustic resonator, I is the current applied to the acoustic resonator, $C_c$ is the clamped capacitance, $Z_a$ is the impedance looking into the acoustic resonator, 1:n is the turns ratio of a transformer that converts the electrical signal into acoustic resonance, $v_1$ and $v_2$ are the particle velocities at the surfaces of the acoustic resonator, $F_1$ and $F_2$ are the acoustic forces at the surfaces of the acoustic resonator, $Z_0$ is the characteristic impedance of the acoustic transmission line, and γ is the propagation constant of the acoustic transmission line. In the KLM model, each acoustic layer (including electrodes, dielectrics, substrates, etc) is specified by a mass density $\rho_m$ and an acoustic wave velocity $v_p$, from which equivalent transmission-line parameters (the characteristic impedance $Z_0$ and propagation constant β) can be computed as follows:

$$Z_0 = A \rho_m v_p$$

$$\beta = \frac{\omega}{v_p}$$

where A is the active device area (electrode area) and ω is the frequency of resonance. The acoustic loss in each layer is specified by a mechanical viscosity η, such that the attenuation factor α is given by $$\alpha = \frac{\eta \omega}{2 \rho_m v_p}$$

and each layer is defined by a complex propagation constant γ=α+jβ. In addition to these parameters, the piezoelectric layer (BST in the present invention) is further characterized by a piezoelectric strain constant $d_m$[C/N] which relates the applied electric field to the resulting mechanical strain (deformation). It can be shown that the remaining equivalent circuit parameters in the KLM model are given by:

$$n = \frac{j\omega}{2h} \frac{Z_0}{\sinh(\gamma \ell / 2)}$$

$$Z_a = \frac{h^2}{\omega^2} \frac{\sinh \gamma l}{Z_0}$$

where $$h = \frac{c_m d_m}{\varepsilon^S}$$

$$\varepsilon^S = \varepsilon - c_m d_m^2$$

and l is the length of the acoustic transmission line, and $c_m$ is the stiffness constant, related to the mass density and acoustic velocity as $c_m = \rho_m v_p^2$. Note that ∈ is the permittivity of the material with no mechanical stress, and $\in^S$ is the permittivity that would be measured if the material were clamped to prevent deformation. Since the piezoelectric strain constant often appears in combination with other parameters, piezoelectric materials are often characterized by a dimensionless piezoelectric coupling constant $K^2$, or the electromechanical coupling constant $k_t^2$, related by $$K^2 = \frac{c_m d_m^2}{\varepsilon^S}$$

$$k_t^2 = \frac{K^2}{K^2 + 1}$$

These formulas are convenient for calculations related to complex multi-layered structures.

Figure 5:
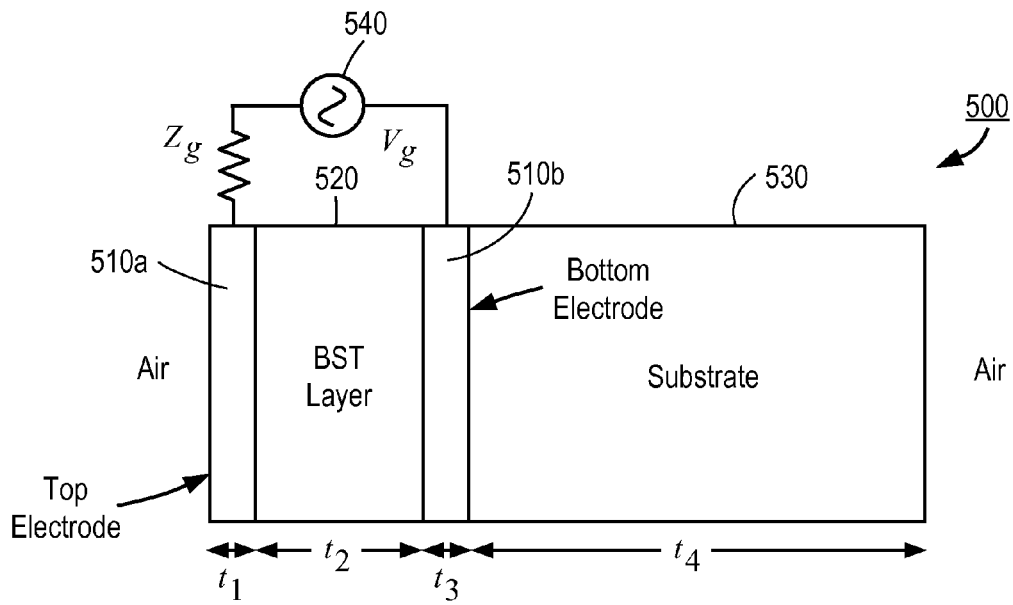
FIG. 5 illustrates the structure and use of the BST-based FBAR (Film Bulk Acoustic Resonator) according to one embodiment of the present invention.

FIG. 5 illustrates the structure and use of the BST-based FBAR 500 according to one embodiment of the present invention. The BST-based FBAR device 500 includes a BST (e.g., $Ba_xSr_{1-x}TiO_3$) layer 520 disposed between a top electrode 510a and a bottom electrode 510b supported by a substrate 530 (e.g., Sapphire). The substrate material 530 is not limited to Sapphire and other materials such as Silicon can be used suitably. The top electrode 510a, the BST layer 520, the bottom electrode 510b, and the substrate 530 has a thickness of $t_1$, $t_2$, $t_3$, and $t_4$, respectively. As explained above, the BST-based FBAR device 500 illustrates the characteristics of an FBAR device under non-zero DC bias voltage. A voltage $V_g$ 540 (including a DC component and an AC component) is applied to the electrodes 510a, 510b through the input impedance $Z_g$. A DC voltage generating an electric field of 1 MV/cm across the FBAR device 500 can change the dielectric constant of the BST material 520 by factors of 2 to 3, leading to different frequency responses of the FBAR device 500 as illustrated in FIG. 4. However, under zero DC bias voltage, the FBAR device 500 loses the characteristics of an FBAR, and has characteristics similar to a simple thin film capacitor.

Figure 6:
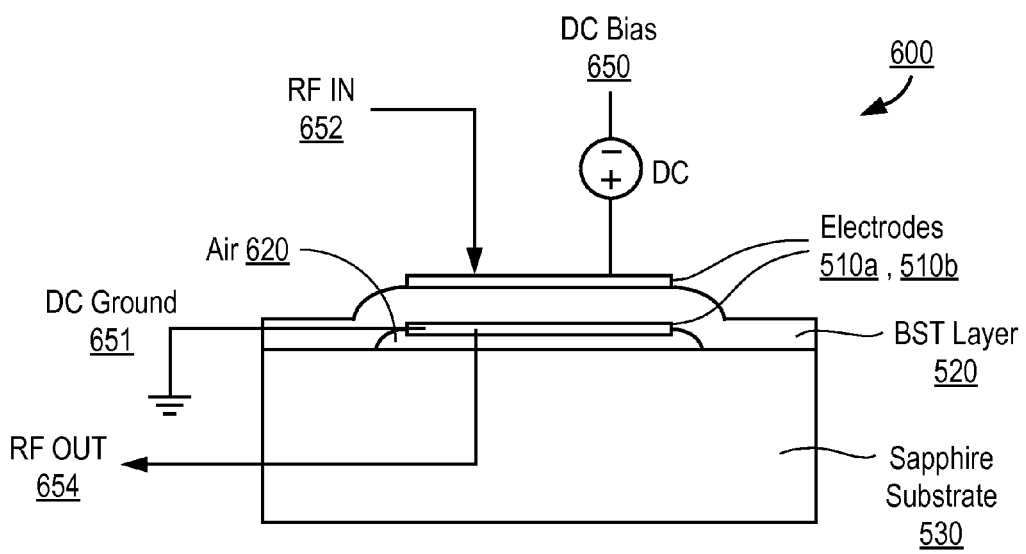
FIG. 6 illustrates the structure of the BST-based FBAR, according to one embodiment of the present invention.

FIG. 6 illustrates the structure of the BST-based FBAR 600, according to one embodiment of the present invention. The FBAR 600 is fabricated on a sapphire substrate 530, and includes top and bottom electrodes 510a, 510b and a BST layer 520 disposed between the top and bottom electrodes 510a, 510b. The substrate material 530 is not limited to Sapphire and other materials such as Silicon can be used suitably. Note that the FBAR 600 device is formed over air 620 such that there is an air gap 620 between the bottom electrode 510b and the sapphire substrate 530. The air gap 620 reduces the damping of the resonance caused by the substrate 530. DC bias 650 is applied to the top electrode 510a, and the bottom electrode 510b is connected to DC ground 651. The RF signal 652 is input to the top electrode 510a, passes through the BST layer 520, and is output 654 from the bottom electrode 510b.

Figure 7A:
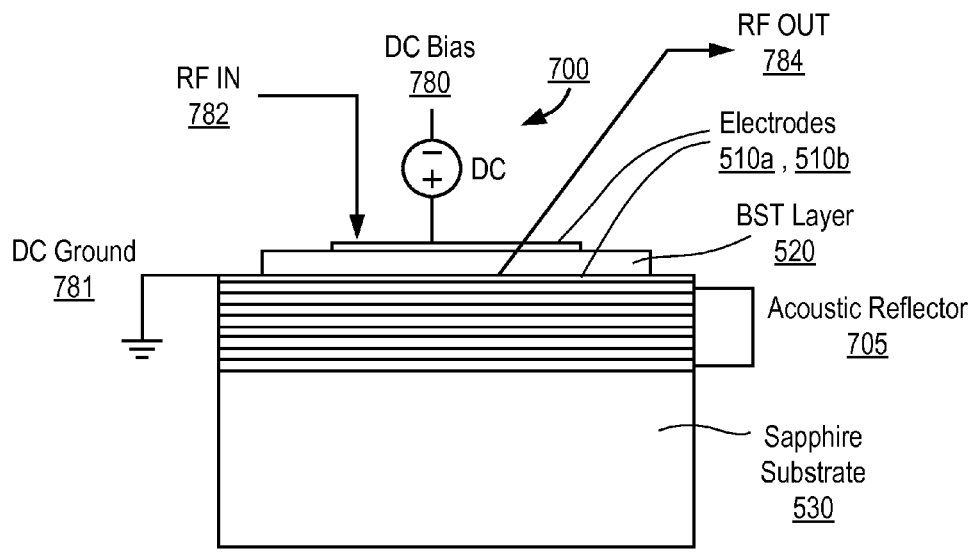
FIG. 7A illustrates the structure of the BST-based FBAR, according to another embodiment of the present invention.

FIG. 7A illustrates the structure of the BST-based FBAR 700, according to another embodiment of the present invention. The FBAR 700 is fabricated on a sapphire substrate 530, and includes top and bottom electrodes 510a, 510b and a BST layer 520 disposed between the top and bottom electrodes 510a, 510b. The substrate material 530 is not limited to Sapphire and other materials such as Silicon can be used suitably. Note that the FBAR 700 device in FIG. 7A is fabricated on an acoustic reflector 705 which is disposed on the sapphire substrate 530. The acoustic reflector 705 (also referred to as an "acoustic mirror") functions to reduce the damping of the resonance caused by the substrate 530, as will be explained in more detail with reference to FIG. 7B. DC bias 780 is applied to the top electrode 510a, and the bottom electrode 510b is connected to DC ground 781. The RF signal 782 is input to the top electrode 510a, passes through the BST layer 520, and is output 784 from the bottom electrode 510b.

Figure 7B:
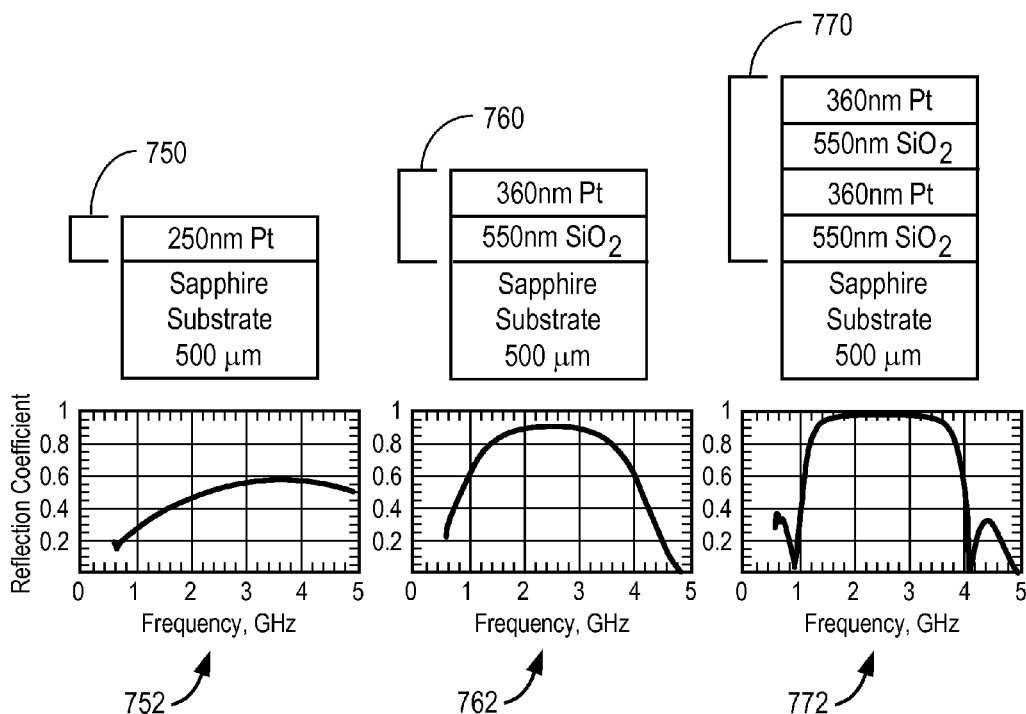
FIG. 7B illustrates the various structures of the acoustic reflector that can be used with the BST-based FBAR of FIG. 7A.

FIG. 7B illustrates the various structures of the acoustic reflector 705 that can be used in the BST-based FBAR 700 of FIG. 7A. The acoustic reflector 705 is made from alternating quarter-wavelength layers of high and low acoustic impedance materials. The acoustic impedance is related to the mass-density and sound velocity of the materials. For a BST-based device, platinum (Pt) layers are highly desirable because Pt is refractory (can withstand high BST deposition temperatures), resistant to oxidation, and has a large work function, forming a large Schottky barrier at the interface to reduce leakage. Pt also has an extremely large mass density, making it very attractive as the high impedance layer in an acoustic mirror stack. At the opposite end of the spectrum, $SiO_2$ is a very attractive and commonly-used as a low-impedance layer. FIG. 7B shows the improvement in reflection coefficient for three simple acoustic mirror stacks 750, 760, 770. The acoustic reflector 750 has a simple Pt electrode disposed on a sapphire substrate, showing a reflection coefficient as in graph 752. The acoustic reflector 760 has a 2-layer Pt/$SiO_2$ mirror disposed on a sapphire substrate, showing a reflection coefficient as in graph 762. The acoustic reflector 770 has a 4-layer Pt/$SiO_2$ mirror disposed on a sapphire substrate, showing a reflection coefficient as in graph 772. In the latter two cases (acoustic mirrors 760, 770) the layer thicknesses were chosen to be a quarter-wavelength at 2.5 GHz. It can be seen the reflection coefficient improves as the acoustic reflector has multiple Pt/$SiO_2$ layers as in the acoustic mirror 760, 770.

Figure 8:
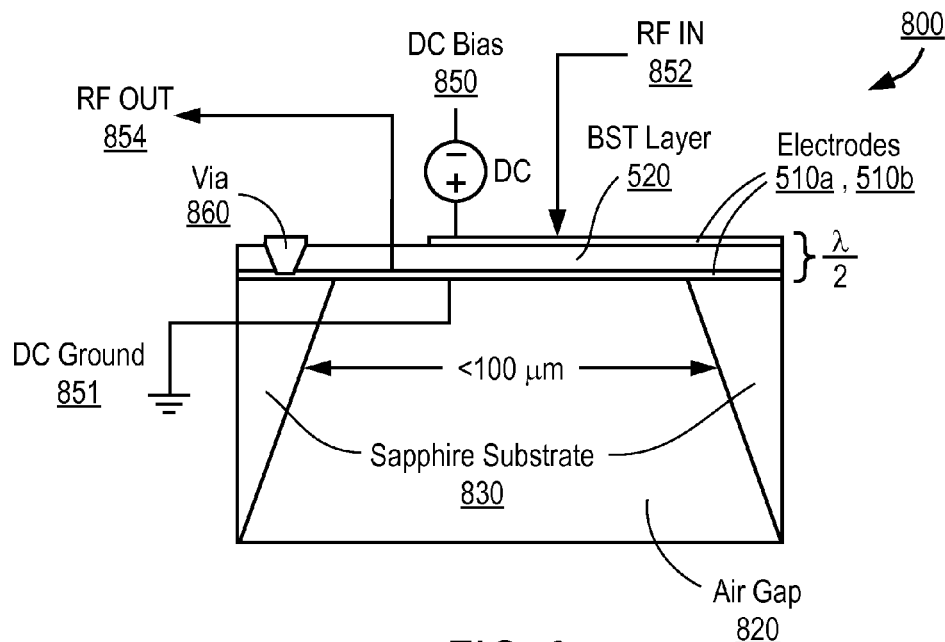
FIG. 8 illustrates the structure of the BST-based FBAR device, according to still another embodiment of the present invention.

FIG. 8 illustrates the structure of the BST-based FBAR device 800, according to still another embodiment of the present invention. The FBAR 800 is fabricated on a sapphire substrate 830, and includes top and bottom electrodes 510*a*, 510*b* and a BST layer 520 disposed between the top and bottom electrodes 510*a*, 510*b*. The substrate material 530 is not limited to Sapphire and other materials such as Silicon can be used suitably. Note that the sapphire substrate 830 has a pair of tapered parts (tapered as they become further away from the bottom electrode 510*b*) with an air gap 820 disposed between the pair of tapered parts of the sapphire substrate 830. Thus, the FBAR 800 device in FIG. 8 is disposed partly on the sapphire substrate 830 and partly on the air gap 820. The air gap 820 is created by milling away the substrate 530. The air gap 820 also reduces the damping of the resonance of the FBAR device 800 that would otherwise be caused by the substrate 530. The via 860 provides a conduit for electrical connection to the bottom electrode 510*b*. DC bias 850 is applied to the top electrode 510*a*, and the bottom electrode 510*b* is connected to DC ground 851. The RF signal 852 is input to the top electrode 510*a*, passes through the BST layer 520, and is output 854 from the bottom electrode 510*b*.

Figure 9:
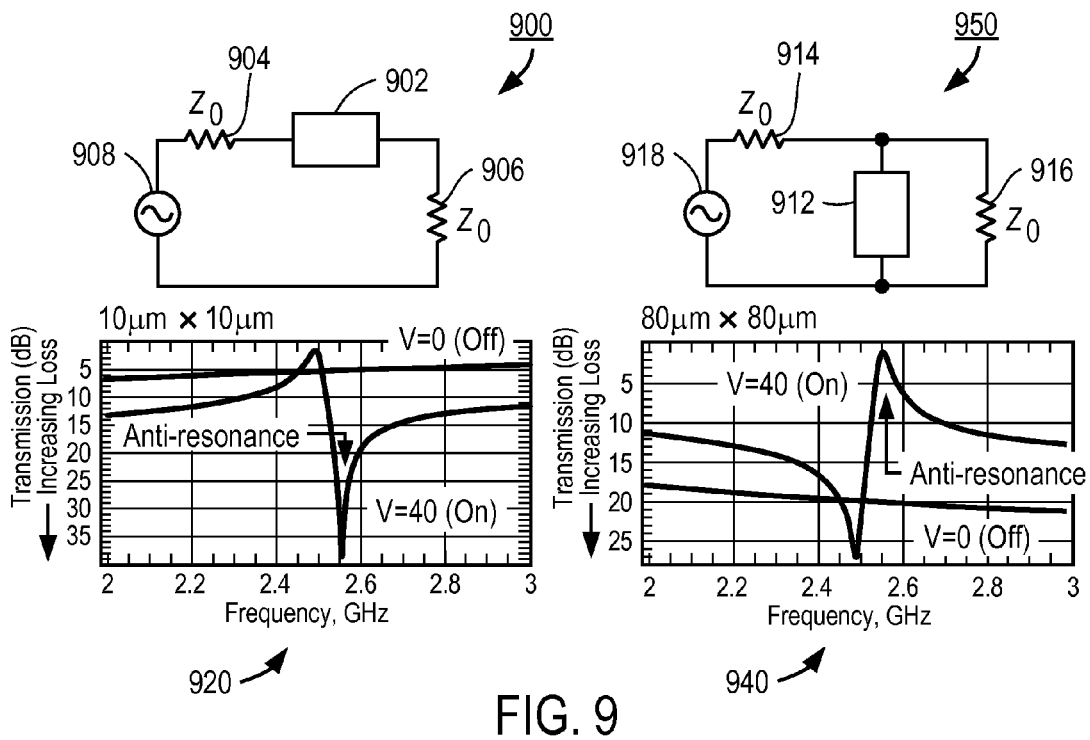
FIG. 9 illustrates the simulated behavior of a single BST-based FBAR device in series and shunt configurations.

FIG. 9 illustrates the simulated behavior of a single BST-based FBAR device in series 900 and shunt 950 configurations. A clear way to exploit the voltage-dependent piezoelectric coupling of the BST-based FBAR devices is by designing the circuits to maximize the impedance differential between "off" (zero bias) and "on" (maximum bias) states. The series configuration 900 includes the FBAR device 902 in series with an input impedance 904 ($Z_0$) receiving an input RF input signal 908 and an output impedance 906 ($Z_0$) for the RF output signal. In the transmission loss graph 920 for the series configuration 900, it can be seen that the anti-resonance occurs around 2.55 GHz when a DC bias of 40 V is applied to the FBAR device 902, while no anti-resonance occurs when no DC bias is applied (0 Volt). The shunt configuration 950 includes an input impedance 914 ($Z_0$) receiving an RF input signal 918, and the FBAR device 912 in parallel with the output impedance 916 ($Z_0$) for the RF output signal. In the transmission loss graph 940 for the shunt configuration 950, it can be seen that the anti-resonance also occurs around 2.55 GHz when a DC bias of 40 V is applied to the FBAR device 912, while no anti-resonance occurs when no DC bias is applied (0 Volt). Note that the simulations in FIG. 9 include electrical losses associated with the material loss tangent and series resistance of the electrodes, as well as mechanical damping and acoustic losses in the electrodes and substrates of the FBAR devices 902, 912. Further improvements in performance can be obtained by using more advanced acoustic mirror stacks and higher-quality BST films. BST films are usually engineered for high-tunability at the expense of higher loss tangents; in this application, BST composition and deposition conditions could be optimized purely for low loss tangents, since a large capacitive tunability is not necessary for the proper functioning of these devices.

The switched and tunable resonance properties of the BST-based FBAR devices can be used in modern communication systems where frequency-agile or reconfigurable components are becoming increasingly important and necessary to cope with a multitude of signal frequencies and modulation formats, including analog front-end components near the antenna, such as filters, duplexers, antenna and amplifier matching networks, etc. This is a difficult problem area for electronics because the transmit power levels and associated RF voltage swings can be quite large, raising breakdown and linearity concerns, while at the same time the receive signal levels are extremely low, placing a premium on insertion loss to maintain an acceptable signal-to-noise ratio. Since the BST-based FBAR devices according to the present invention are switchable and tunable, they are functionally equivalent to a high-selectivity filter and a low-loss switch, where the switch draws no DC power. An array of such filters could implement a very compact and reconfigurable high-selectivity filter bank. Similarly, BST-based FBARs could be combined to make a low-loss and high-selectivity duplexer or TR switch. There are many other possibilities for frequency-agile components.

Figure 10A:
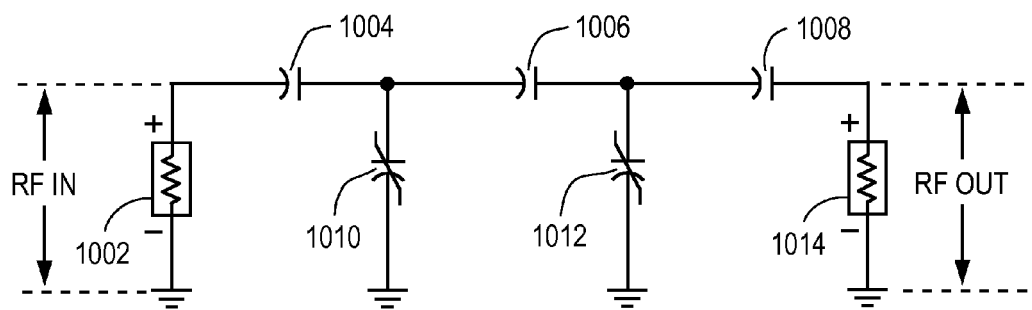
FIG. 10A illustrates a band pass filter circuit implemented using the BST-based FBAR devices according to one embodiment of the present invention.

FIG. 10A illustrates a band pass filter circuit implemented using the BST-based FBAR devices according to one embodiment of the present invention. The "ladder" filter network shown in FIG. 10A includes capacitors 1004, 1006, 1008 and BST-based FBAR devices 1010, 1012, receiving an RF input signal through an input impedance 1002 and generating an RF output signal across the output impedance 1014. The BST-based FBAR devices 1010, 1012 may be of any configuration as illustrated in FIG. 5, 6, 7A, or 8. The "ladder" filter network shown in FIG. 10A is essentially a combination of capacitively-coupled shunt resonators, and can be optimized using classical filter techniques.

Figure 10B:
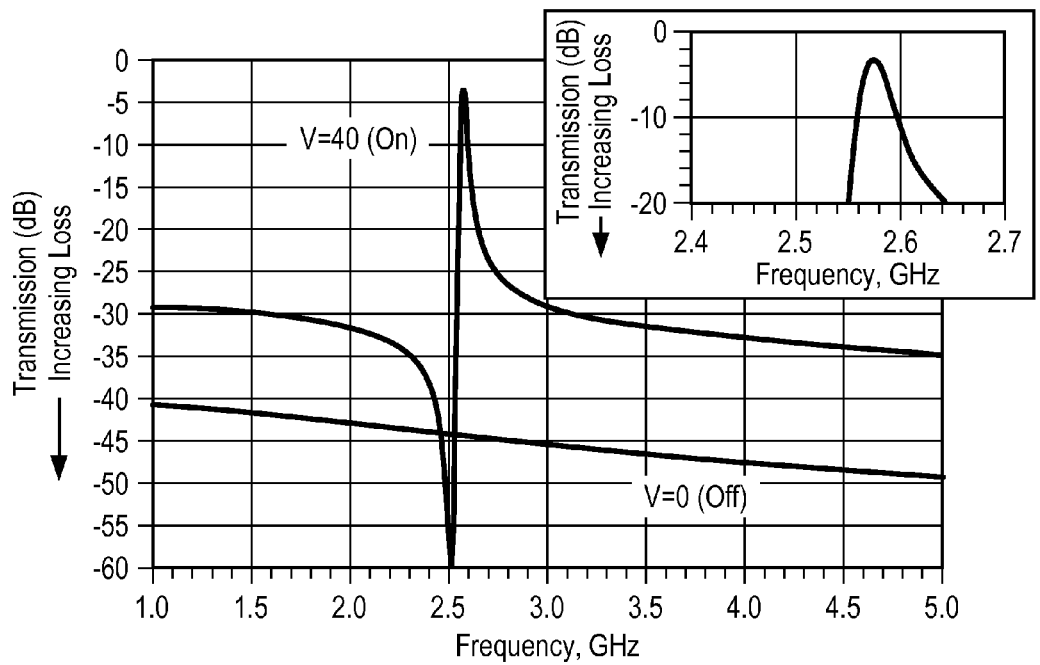
FIG. 10B is a graph illustrating RF transmission measurements, as a function of the frequency of the RF signal, of the band pass filter circuit of FIG. 10A implemented using the BST-based FBAR devices according to one embodiment of the present invention.

FIG. 10B is a graph illustrating RF transmission simulation results, as a function of the frequency of the RF signal, of the band pass filter circuit implemented using the BST-based FBAR devices according to one embodiment of the present invention in FIG. 10A. It is apparent that the filter network of FIG. 10A exhibits the characteristics of a 2-pole band pass filter when a DC bias of 40 V is applied to the FBAR devices 1010, 1012 but that a steady frequency response occurs when the DC bias is off (0 volt). In this simple filter network with only two BST FBAR devices 1010, 1012, over a 40 dB on-off dynamic range can be obtained, with less than 3 dB insertion loss.

Figure 10C:
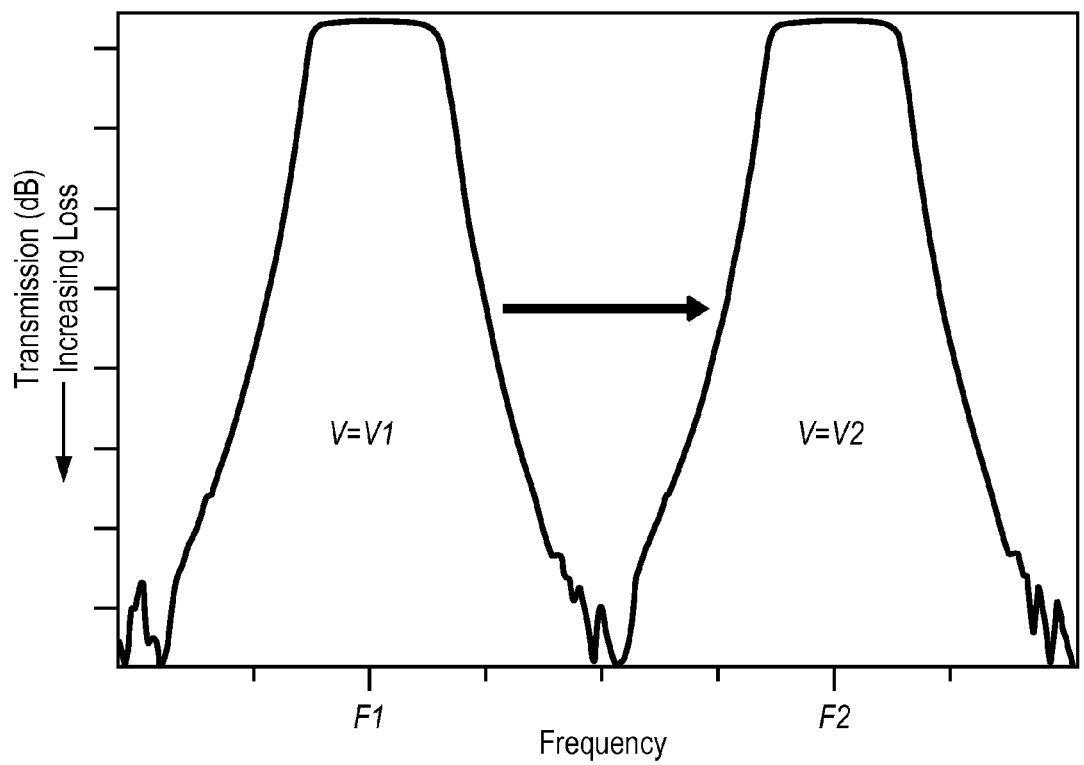
FIG. 10C is a graph illustrating how the RF transmission measurements of the band pass filter circuit of FIG. 10A implemented using the BST-based FBAR devices change depending upon different DC bias voltages.

FIG. 10C is a graph illustrating how the RF transmission measurements of the band pass filter circuit implemented using the BST-based FBAR devices as in FIG. 10A change depending upon different DC bias voltages applied to the BST-based FBAR devices. When the DC bias voltage applied to the BST-based FBAR devices 1010, 1012 is V1, the center frequency of the band pass filter is positioned at F1. By changing the DC voltage applied to the BST-based FBAR devices 1010, 1012 to V2, the filter response shifts upwards and settles at the new center frequency of F2. Therefore, the filter of FIG. 10A is not only switchable based on whether a DC bias voltage is applied, but its frequency response is also tunable based on the level of the DC bias voltage. Thus, the filter of FIG. 10A essentially has multiple frequency bands. For example, a DC bias voltage of V1 applied to the filter network would enable operation of Band 1 centered at F1 while suppressing Band 2 centered at V2. Conversely, a DC bias voltage of V2 would enable Band 2 centered at F2 while disabling Band 1 centered at F1.

Figure 11:
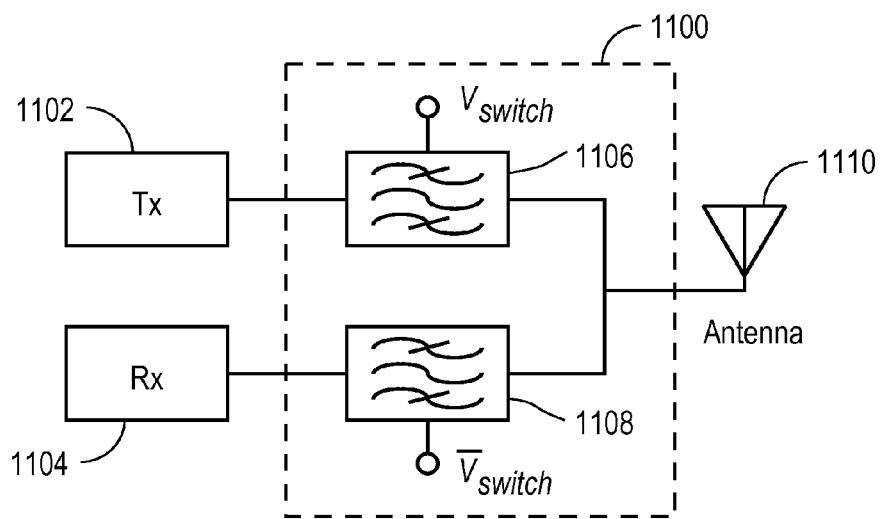
FIG. 11 illustrates a duplexer implemented using the BST-based FBAR devices according to one embodiment of the present invention.

With building blocks such as the filter circuit in FIG. 10A, numerous high-level functional components can be realized. FIG. 11 illustrates a duplexer 1100 implemented using the BST-based FBAR devices according to one embodiment of the present invention. The duplexer 1100 includes two BST-based FBAR filter circuits 1106, 1008, such as those shown in FIG. 10A, to route signals between the antenna 1110 and the transmit (Tx) block 1102 or the receive (Rx) block 1104. When the BST-based FBAR filter 1106 in the transmit path is activated by applying a non-zero DC bias voltage ($V_{switch}$) to the BST-based FBAR 1106, the BST-based FBAR filter 1108 in the receive path is turned off, thus isolating the receiver 1104 from the transmit signal 1102. When the BST-based FBAR filter 1108 in the receive path is activated by applying a non-zero DC bias voltage ($\sim V_{switch}$) to the BST-based FBAR 1108, the BST-based FBAR filter 1106 in the transmit path is turned off, thus isolating the transmitter 1102 from the receive signal 1104. The great advantage here is that both the switching and filtering functions can be integrated together in one device, which is monolithically integrated on a single chip, and furthermore the DC control circuit draws no current. A duplexer functionality can be implemented using filters with different pass band frequencies for the Tx and Rx paths, by applying different DC bias voltages to the BST-based FBAR filters 1106, 1108.

Figure 12A:
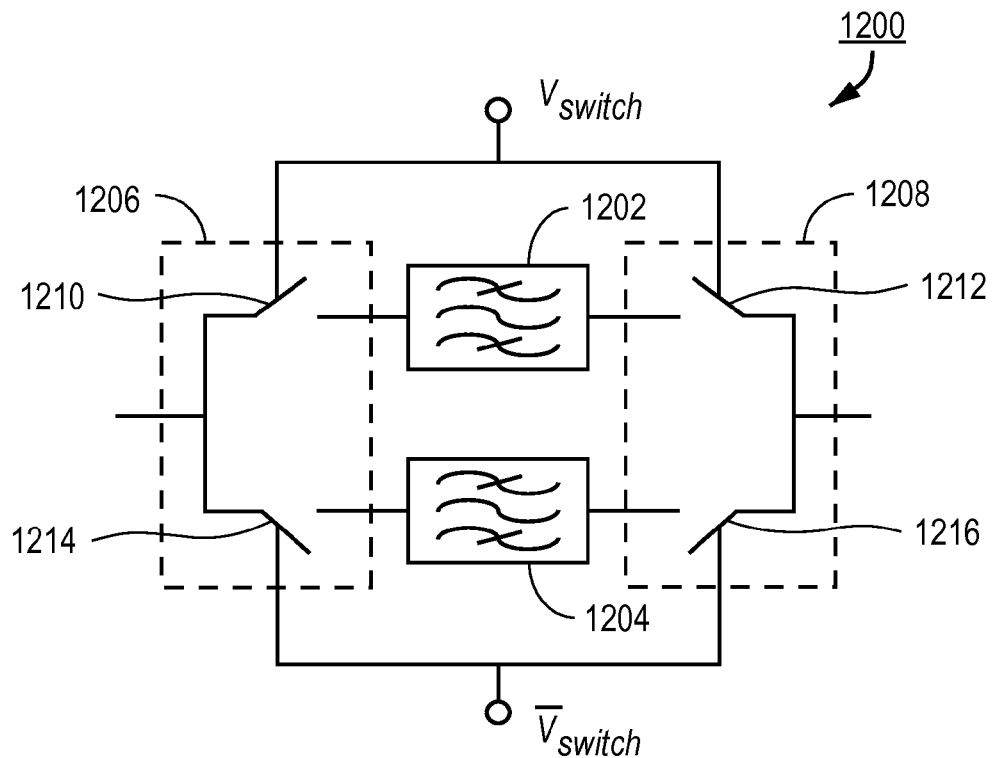
FIG. 12A illustrates a conventional switched filter bank.

Voltage-selectable band-pass or band-reject filter structures like those shown in FIG. 10A can be combined in parallel to implement compact, reconfigurable filter banks FIG. 12A illustrates a conventional switched filter bank 1200, including conventional FBAR switches 1202, 1204. The conventional FBAR switches 1202, 1204 are not independently switchable, and thus the DC switching signals ($V_{switch}$ and $\sim V_{switch}$) are applied to the switches 1210, 1212, 1214, 1216 to externally turn on or off the conventional FBAR filters 1202, 1204.

Figure 12B:
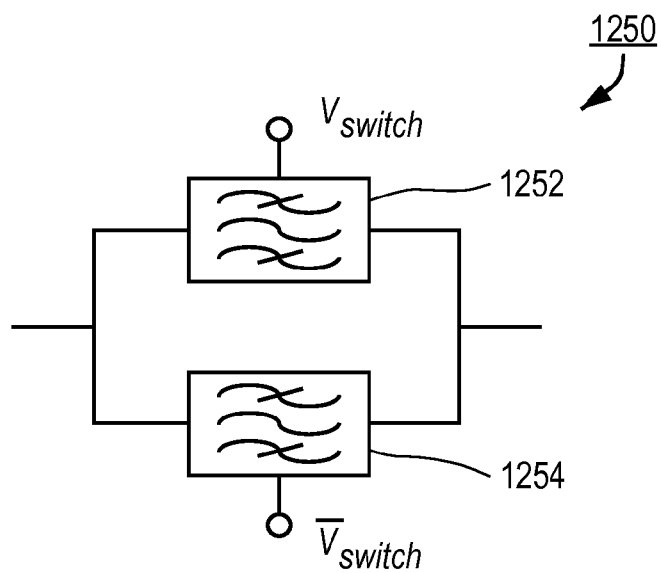
FIG. 12B illustrates a switched filter bank implemented using the BST-based FBAR devices according to one embodiment of the present invention.

In contrast, FIG. 12B illustrates a switched filter bank 1250 implemented using the BST-based FBAR devices according to one embodiment of the present invention. The filter bank 1250 includes two BST-based FBAR filters 1252, 1254. Note that the BST-based FBAR filters 1252, 1254 are switched directly by the DC switching signals ($V_{switch}$ and $\sim V_{switch}$) because the BST-based FBAR filters 1252, 1254 are switchable based on whether a DC bias signal is applied thereto. Thus, the switched filter bank 1250 does not require external switches to switch on or off the BST-based FBAR filters 1252, 1254.

Upon reading this disclosure, those of ordinary skill in the art will appreciate still additional alternative structural and functional designs for a BST-based FBAR device and its applications through the disclosed principles of the present invention. Thus, while particular embodiments and applications of the present invention have been illustrated and described, it is to be understood that the invention is not limited to the precise construction and components disclosed herein. Various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. An acoustic resonator comprising:
    a first electrode coupled to an adjustable DC voltage source, the adjustable DC voltage source configured to output a DC bias voltage having a predetermined range;
    a second electrode; and
    a barium strontium titanate (BST) dielectric layer disposed between the first electrode and the second electrode, the acoustic resonator being configured to be switched on with a resonant frequency by causing the adjustable DC voltage source to apply the DC bias voltage across the BST dielectric layer, wherein the resonant frequency is tuned based on a level of the DC bias voltage applied within the predetermined range, and the acoustic resonator being configured to be switched off by causing the adjustable DC voltage source to remove the DC bias voltage across the BST dielectric layer.

2. The acoustic resonator of claim 1, wherein the acoustic resonator is used as part of a duplexer for transmitting and receiving a radio frequency signal over an antenna.

3. The acoustic resonator of claim 1, wherein the resonant frequency increases as the level of the DC bias voltage applied by the adjustable DC voltage source increases.

4. The acoustic resonator of claim 1, wherein the acoustic resonator is formed on a sapphire substrate.

5. The acoustic resonator of claim 1, wherein the acoustic resonator is formed over an air gap disposed between the second electrode and a substrate supporting the acoustic resonator.

6. The acoustic resonator of claim 1, wherein the acoustic resonator is formed over an acoustic reflector disposed between the second electrode and a substrate supporting the acoustic resonator, the acoustic reflector reducing damping of resonance of the acoustic resonator caused by the substrate.

7. The acoustic resonator of claim 6, wherein the acoustic reflector comprises a Platinum (Pt) layer.

8. The acoustic resonator of claim 6, wherein the acoustic reflector comprises a plurality of alternating layers of Platinum (Pt) and Silicon Dioxide ($SiO_2$).

9. The acoustic resonator of claim 1, wherein the acoustic resonator includes a first part formed over a substrate and a second part formed over an air gap.

10. The acoustic resonator of claim 1, wherein the acoustic resonator is used as part of a switchable filter.

11. A filter for filtering a frequency range of a signal, the filter comprising:
    at least a capacitor; and
    at least an acoustic resonator coupled to the capacitor, the acoustic resonator including:
        a first electrode coupled to an adjustable DC voltage source, the adjustable DC voltage source configured to output a DC bias voltage having a predetermined range;
        a second electrode;
        a barium strontium titanate (BST) dielectric layer disposed between the first electrode and the second electrode, the acoustic resonator being configured to be switched on with a resonant frequency by causing the adjustable DC voltage source to apply the DC bias voltage across the BST dielectric layer, wherein the resonant frequency is tuned based on a level of the DC bias voltage applied within the predetermined range, and the acoustic resonator being configured to be switched off by causing the adjustable DC voltage source to remove the DC bias voltage across the BST dielectric layer.

12. The filter of claim 11, wherein the acoustic resonator includes a first part formed over a substrate and a second part formed over an air gap.

13. The filter of claim 11, wherein the acoustic resonator is formed over an air gap disposed between the second electrode and a substrate supporting the acoustic resonator.

14. The filter of claim 11, wherein the resonant frequency increases as the level of the DC bias voltage applied by the adjustable DC voltage source increases.

15. The filter of claim 11, wherein the acoustic resonator is formed on a sapphire substrate.

16. The filter of claim 11, wherein the acoustic resonator is formed over an acoustic reflector disposed between the second electrode and a substrate supporting the acoustic resonator, the acoustic reflector reducing damping of resonance of the acoustic resonator caused by the substrate.

17. The filter of claim 16, wherein the acoustic reflector comprises a plurality of alternating layers of Platinum (Pt) and Silicon Dioxide ($SiO_2$).

18. The filter of claim 16, wherein the acoustic reflector comprises a Platinum (Pt) layer.

* * * * *